United States Patent
Yang et al.

(10) Patent No.: US 7,795,740 B2
(45) Date of Patent: *Sep. 14, 2010

(54) ADHESION ENHANCEMENT FOR METAL/DIELECTRIC INTERFACE

(75) Inventors: Chih-Chao Yang, Poughkeepsie, NY (US); Griselda Bonilla, Fishkill, NY (US); Qinghuang Lin, Yorktown Heights, NY (US); Terry A. Spooner, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/245,133

(22) Filed: Oct. 3, 2008

(65) Prior Publication Data

US 2009/0026625 A1    Jan. 29, 2009

Related U.S. Application Data

(62) Division of application No. 11/440,984, filed on May 25, 2006, now Pat. No. 7,446,058.

(51) Int. Cl.
    *H01L 21/4763* (2006.01)
    *H01L 23/48* (2006.01)
(52) U.S. Cl. ............... 257/774; 257/751; 257/758; 438/627; 438/629
(58) Field of Classification Search ............ 257/751, 257/758, 774; 438/627, 629
See application file for complete search history.

(56) References Cited

U.S. PATENT DOCUMENTS

| 4,591,480 A | 5/1986 | Morishita et al. |
| 5,133,840 A | 7/1992 | Buchwalter et al. |
| 5,221,449 A | 6/1993 | Colgan et al. |
| 5,281,485 A | 1/1994 | Colgan et al. |
| 5,900,443 A | 5/1999 | Stinnett et al. |
| 5,930,669 A | 7/1999 | Uzoh |

(Continued)

FOREIGN PATENT DOCUMENTS

CN    1527366 A    9/2004

(Continued)

OTHER PUBLICATIONS

Lane, Michael et al., "Interfacial Relationships in Microelectronic Devices." *Mat. Res. Soc. Symp. Proc.*, 766, 153 (2003).

(Continued)

*Primary Examiner*—Fernando L Toledo
(74) *Attorney, Agent, or Firm*—Scully, Scott, Murphy & Presser, P.C.; Louis J. Percello, Esq.

(57) ABSTRACT

An interconnect structure and method of fabricating the same in which the adhesion between a chemically etched dielectric material and a noble metal liner is improved are provided. In accordance with the present invention, a chemically etching dielectric material is subjected to a treatment step which modified the chemical nature of the dielectric material such that the treated surfaces become hydrophobic. The treatment step is performed prior to deposition of the noble metal liner and aides in improving the adhesion between the chemically etched dielectric material and the noble metal liner.

11 Claims, 3 Drawing Sheets

U.S. PATENT DOCUMENTS

| | | |
|---|---|---|
| 6,291,885 B1 | 9/2001 | Cabral, Jr. et al. |
| 6,429,519 B1 | 8/2002 | Uzoh |
| 6,437,440 B1 | 8/2002 | Cabral, Jr. et al. |
| 6,677,251 B1 | 1/2004 | Lu et al. |
| 6,800,928 B1 | 10/2004 | Lee et al. |
| 6,838,300 B2 | 1/2005 | Jin et al. |
| 6,861,355 B2 | 3/2005 | Marsh |
| 6,921,722 B2 | 7/2005 | Ogure et al. |
| 7,232,769 B2 | 6/2007 | Nakashima et al. |
| 7,446,058 B2 * | 11/2008 | Yang et al. ............... 438/781 |
| 2004/0175501 A1 | 9/2004 | Lukas et al. |
| 2004/0175957 A1 | 9/2004 | Lukas et al. |
| 2004/0227243 A1 | 11/2004 | Perng |
| 2004/0229453 A1 | 11/2004 | Perng |
| 2005/0106762 A1 | 5/2005 | Chakrapani et al. |
| 2005/0133920 A1 | 6/2005 | Liou et al. |
| 2005/0184397 A1 | 8/2005 | Gates et al. |
| 2006/0084277 A1 | 4/2006 | Nakashima et al. |
| 2006/0172531 A1 | 8/2006 | Lin et al. |
| 2006/0189133 A1 | 8/2006 | Dimitrakopoulos et al. |
| 2006/0214305 A1 | 9/2006 | Sakata et al. |
| 2007/0228570 A1 | 10/2007 | Dimitrakopoulos et al. |
| 2007/0232062 A1 | 10/2007 | Nogami |
| 2007/0293049 A1 | 12/2007 | Minamihaba et al. |
| 2008/0042283 A1 * | 2/2008 | Purushothaman et al. ... 257/754 |

FOREIGN PATENT DOCUMENTS

WO    WO2006/049595 A1    5/2006

OTHER PUBLICATIONS

Lane, M. W. et al., "Liner Materials for Direct Electrodeposition of Cu." *Apl. Phys. Ltrs.* vol. 83 (12) (2003).

* cited by examiner

ADHESION ENHANCEMENT FOR METAL/DIELECTRIC INTERFACE

RELATED APPLICATIONS

This application is a divisional of U.S. Ser. No. 11/440,984, filed May 25, 2006, now U.S. Pat. No. 7,446,058.

FIELD OF THE INVENTION

The present invention relates to a semiconductor structure and a method of fabricating the same. More particularly, the present invention relates to an interconnect structure having improved adhesion between a noble metal liner and an adjacent dielectric material. The improved adhesion is provided by surface treating a chemically etched dielectric material to create a hydrophobic surface. This hydrophobic surface on the dielectric material in turn enhances the adhesion strength of the dielectric material for the subsequently disposed noble metal liner.

BACKGROUND OF THE INVENTION

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In current interconnect structures, a layer of plasma vapor deposited (PVD) TaN and a PVD Cu seed layer are used as a Cu diffusion barrier and plating seed, respectively, for advanced interconnect applications. However, with decreasing critical dimension, it is expected that the PVD-based deposition techniques will run into conformality and coverage issues. These, in turn, will lead to fill issues at plating, such as center and edge voids, which cause reliability concerns and yield degradation.

One way around this problem is to reduce the overall thickness of PVD material, and utilize a single layer of liner material which serves as both the diffusion barrier and plating seed. Another way around the aforementioned issue is the use of chemical vapor deposition (CVD) or atomic layer deposition (ALD) which result in better step coverage and conformality as compared with conventional PVD techniques. CYD or ALD ruthenium, Ru, and iridium, Ir, have the potential of replacing current PVD based barrier/plating seed for advanced interconnect applications. See, for example, M. Lane et al., "Liner Materials for Direct Electrodeposition of Cu", Appl. Phys. Letters, 83, n12, 2330 (2003) and M. Lane et al., "Interfacial Relationships in Microelectronic Devices", Mat. Res. Soc. Symp. Proc, 766, 153 (2003)

The use of CVD or ALD Ru, Ir or other like noble metal is also advantages since Cu and other like metal conductors exhibit good adhesion to noble metals such as, for example, Ru. Moreover, a noble metal-Cu system is thermodynamically stable and has been shown to be substantially immiscible. Furthermore, noble metals such as Ru do not oxidize easily and have a fairly low bulk resistivity. The low resistivity of such noble metals is a necessary feature for it to enable direct electroplating of Cu.

Despite the above advantages that can be obtained utilizing noble metal liners, recent experimental results have revealed poor adhesion between the noble metal liner and the dielectric interface. It is likely that a noble metal, such as Ru, bonds weakly with C and O, and this may be a fundamental problem with deposition of a noble metal directly onto a dielectric surface. Because of the poor noble metal/dielectric adhesion issue, wafer peeling problems have been observed during Cu electroplating and chemical-mechanical polishing (CMP).

In view of the above, there is a need for providing an interconnect structure in which the adhesion between a noble metal liner and an adjacent dielectric material is improved.

SUMMARY OF THE INVENTION

The present invention provides an interconnect structure and method of fabricating the same in which the adhesion between a chemically etched dielectric material and a noble metal liner is improved which enables the incorporation of a noble metal liner in advanced interconnect technology. The inventive interconnect structure and method of fabricating the same also provides better electrical performance than conventional interconnect structures since more volume of the conductive feature is provided.

Another advantage of the present invention is that the inventive interconnect structure uses a single thin-film layer (i.e., a noble metal liner) as a diffusion barrier/plating seed layer instead of a conventional diffusion barrier and plating seed layer as required in conventional interconnect technology. As such, a lower cost interconnect structure is provided in which a noble metal diffusion barrier is used instead of both a diffusion layer and a plating seed layer.

In general terms, the interconnect structure of the present application comprises:

a dielectric material including at least one opening located therein, wherein a surface portion of said dielectric material within said at least one opening is hydrophobic;

a noble metal liner within said at least one opening; and an interconnect conductive material on said noble metal liner.

The at least one opening may include a line region, a via region and a line region or a combination thereof. Single and dual damascene interconnect structures are completed in the present invention. The present invention also contemplates closed-via bottom structures, open-via bottom structures and anchored-via bottom structures.

In addition to the interconnect structure mentioned above, the present invention also provides a method of fabricating the same. In general terms, the method of the present invention comprises:

forming at least one opening in a dielectric material;

treating exposed surfaces of said dielectric material at least within said at least one opening to render said exposed surfaces hydrophobic;

forming a noble metal liner within said at least one opening; and forming an interconnect conductive material on said noble metal liner within said at least one opening.

In accordance with the present invention, the treating step comprises silylation, UV curing or any combination thereof.

DETAILED DESCRIPTION OF THE INVENTION

The present invention, which provides an interconnect structure having improved adhesion between a dielectric material and a noble metal liner as well as a method of fabricating the same, will now be described in greater detail by referring to the following discussion and drawings that accompany the present application. The drawings of the present application, which are referred to in greater detail herein below, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
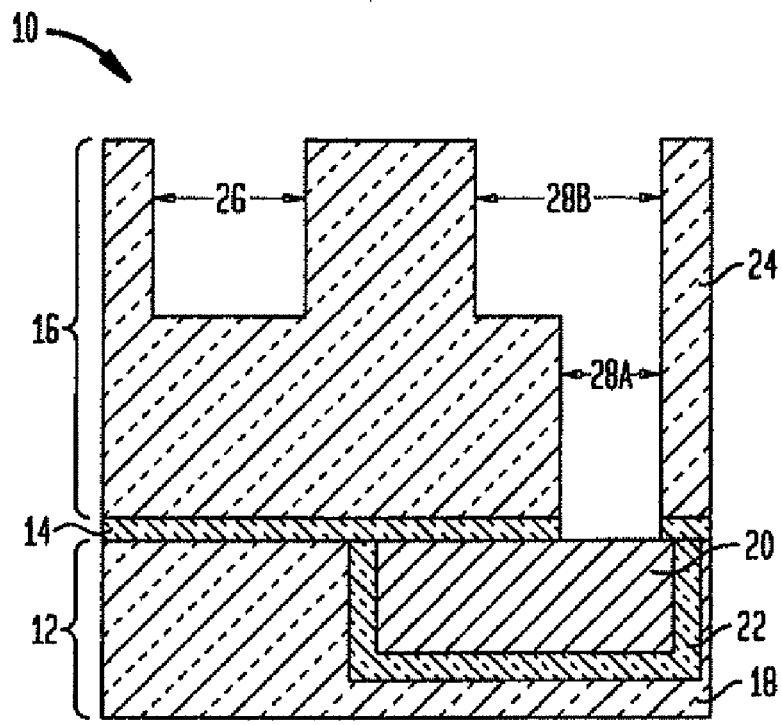
FIG. 1 is a pictorial representation (through a cross sectional view) illustrating an initial interconnect structure through early stages of the inventive method wherein at least one opening is provided into a dielectric material.

The process flow of the present invention begins with providing the initial interconnect structure 10 shown in FIG. 1. Specifically, the initial interconnect structure 10 shown in FIG. 1 comprises a multilevel interconnect including a lower interconnect level 12 and an upper interconnect level 16 that are optionally, but not necessarily always, separated in part by a dielectric capping layer 14. The lower interconnect level 12, which may be located above a semiconductor substrate including one or more semiconductor devices, comprises a first dielectric material 18 having at least one conductive feature (i.e., conductive region) 20 that is separated from the first dielectric material 18 by a barrier layer 22. The upper interconnect level 16 comprises a second dielectric material 24 that has at least one opening located therein.

Specifically, two openings are shown in FIG. 1; reference number 26 denotes a line opening for a single damascene structure, and reference numerals 28A and 28B denote a via opening and a line opening, respectively for a dual damascene structure. Although FIG. 1 illustrates a separate line opening and an opening for a via and a line, the present invention also contemplates cases in which only the line opening is present or cases in which the opening for the combined via and line is present.

The initial interconnect structure 10 shown in FIG. 1 is made utilizing standard interconnect processing which is well known in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous. Some examples of suitable dielectrics that can be used as the first dielectric material 18 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. All dielectric constants mentioned herein are relative to a vacuum. These dielectrics generally have a lower parasitic cross talk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive feature 20 that is embedded in (i.e., located within) the first dielectric material 18. The conductive feature 20 comprises a conductive region that is separated from the first dielectric material 18 by a barrier layer 22. The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 22 and then with a conducive material forming the conductive region. The barrier layer 22, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), sputtering, chemical solution deposition, or plating.

In some embodiments, not specifically shown herein, the first dielectric material 18 may include a modified dielectric surface layer having a reduced hydrophobicity which is formed prior to formation of the barrier layer 22 of the lower interconnect level 12. If present, the modified dielectric surface layer is located between the barrier layer 22 and the first dielectric material 18. Such a modified surface layer is formed utilizing silylation, UV curing or a combination thereof. Such dielectric surface treatment techniques, which provide a hydrophobic surface layer on the dielectric material, will be described in greater detail herein below.

The thickness of the barrier layer 22 may vary depending on the exact means of the deposition process as well as the material employed. Typically, the barrier layer 22 has a thickness from about 4 to about 40 nm, with a thickness form about 7 to about 20 nm being more typical.

Following the barrier layer 22 formation, the remaining region of the opening within the first dielectric material 18 is filled with a conductive material forming the conductive region. The conductive material used in forming the conductive region includes, for example, polySi, a conductive metal, an alloy comprising at least one conductive metal, a conductive metal silicide or combinations thereof. Preferably, the conductive material that is used in forming the conductive region is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to: CVD, PECVD, sputtering, chemical solution deposition or plating. After these depositions, a conventional planarization process such as chemical mechanical polishing (CMP) can be used to provide a structure in which the barrier layer 22 and the conductive feature 20 each have an upper surface that is substantially coplanar with the upper surface of the first dielectric material 18.

After forming the at least one conductive feature 20, a dielectric capping layer 14 is optionally, but not necessarily always, formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the capping layer 14 may vary depending on the technique used to form the same as well as the material make-up of the layer. Typically, the capping layer 14 has a thickness from about 15 to about 55 nm, with a thickness from about 25 to about 45 nm being more typical.

Next, the upper interconnect level 16 is formed by applying the second dielectric material 24 to the upper exposed surface of the optional capping layer 14, if present, or on a surface of the first dielectric material 18. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. Next, at least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation.

In FIG. 1, two openings are shown; reference number 26 denotes a line opening for a single damascene structure, and reference numerals 28A and 28B denote a via opening and a line opening, respectively for a dual damascene structure. It is again emphasized that the present invention contemplates structures including only opening 26 or openings 28A and 28B.

In the instances when a via opening 28A and a line opening 28B are formed, the etching step also removes a portion of the dielectric capping layer 14 that is located atop the conductive feature 20.

Figure 2:
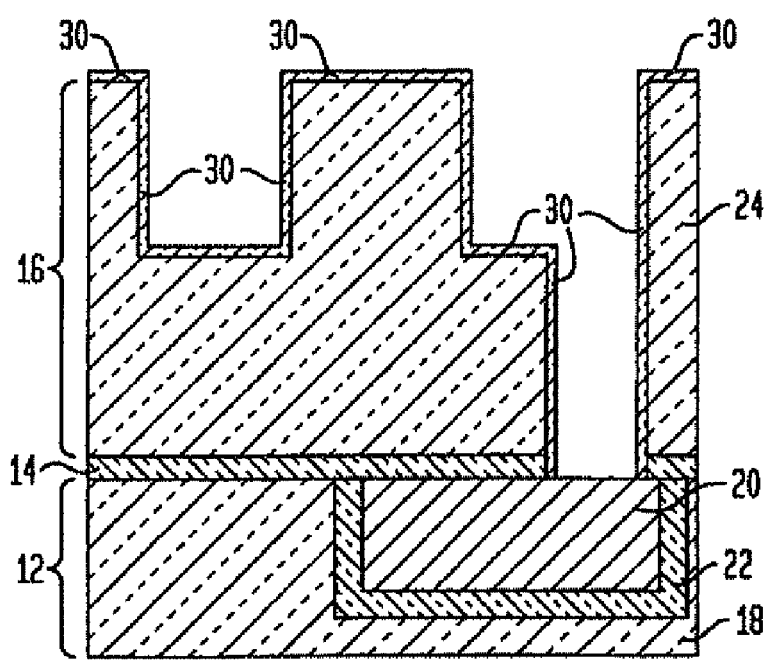
FIG. 2 is a pictorial representation (through a cross sectional view) illustrating the structure of FIG. 1 after creating a modified dielectric surface layer.

Reference is now made to FIG. 2 which shows the structure of FIG. 1 after creating a modified dielectric surface layer 30. As shown, the modified dielectric surface layer 30 is located on exposed surfaces of the second dielectric material 24. In accordance with the present invention, the modified dielectric surface layer 30 is a hydrophobic dielectric surface, which enhances the adhesion strength of the noble metal liner to be subsequently formed. It is noted that in prior art interconnect structures the dielectric material has a hydrophilic surface.

The modified dielectric surface layer 30 is created utilizing silylation, UV curing or combinations thereof.

When silylation is employed, any silylation agent that is well known in the art can be used in the present invention. One class of silylating agents which can be used in the present invention has the general formula $(R_2N)_x SiR'_y$, where x and y are integers from 1 to 3 and 3 to 1, respectively, and R and R' are any of hydrogen, an alkyl, an alkoxy, an aryl, an allyl moiety or a vinyl moiety.

For the present application, the silylation can be performed in spin-on, liquid, vapor (in a furnace or in a CVD chamber), or supercritical $CO_2$ media, for example, as described fully in U.S. Patent Application Publication No. 2005/0106762.

For all cases, it is very important for the purpose of this invention to handle the silylating agent in the total absence of ambient moisture since any moisture that might be present could reduce the efficacy of the silylation reaction. Further, a combination of a silylation followed by an anneal or an anneal followed by a silylation or a high temperature (greater than 200° C.) silylation is preferred to silylation by itself as this results in the greatest decrease of silanol content in the dielectric film.

When the silylating agents are used in a liquid medium, they should preferably be dissolved in any non-polar organic solvent that has a low surface tension such that the pores can be penetrated effectively. Examples of such solvents include, but are not limited to: hexanes, heptanes, xylenes, propylene carbonates, etc. The concentration of the aminosilanes necessary for effective silylation can be as low as 1% by weight of the solution or the silylating agent can be used as such in its undiluted liquid form. The desired range for the most effective silylation is 2% to 10% in solution. The solution can either be spin coated on to the dielectric film or used in a wet chemical tank in which the wafers with the interconnect features defined in the dielectric are immersed for a period ranging from 1 minute to 1 hour or more. The temperature for the silylation can either be room temperature (20°-30° C.) or higher. Following the silylation, the wafers can be rinsed off in the pure solvent and then baked on a hot plate or in a furnace to a temperature up to 450° C. When annealing is employed, the anneal temperature is typically about 200° C. or greater, with an annealing temperature from about 200° to about 350° C. being even more typical.

When UV cure is employed in the present invention, the UV cure is performed in a conventional UV cure tool and the structure is then subjected to a UV exposure step at a substrate temperature from about 200° to about 450° C. The UV exposure step is performed utilizing a source that can generate light having a wavelength from about 150 to about 500 nm, preferably from about 190 to about 250 nm, to irradiate the surface, especially the exposed surface of the dielectric material. The UV exposure step is performed for a time period from about 0.5 to about 100 minutes. The UV exposure may be performed in the presence of an ambient gas such as an inert gas including, for example, He, Ar, Xe, $N_2$ or a mixture thereof such as a forming gas $N_2/O_2$. Optionally, a chemically active gas may be added to the inert gas. Examples of chemically active gases that can optionally be used in the present invention include: $H_2$, $CH_4$, trimethylsilane, ethylene or silane derivatives having the formula $HSiRR_1R_2$ wherein R, $R_1$ and $R_2$ may be the same or different and are selected from group consisting of methyl, ethyl, propyl, vinyl, allyl, methoxy and ethoxy.

The thickness of the modified dielectric surface layer 30 that is created may vary depending on the initial dielectric material employed as well as the exact treatment step employed. Typically, the modified dielectric surface layer 30 has a thickness from about 0.5 to about 8 nm, with a thickness from about 2 to about 4 nm being even more typical.

Figure 3:
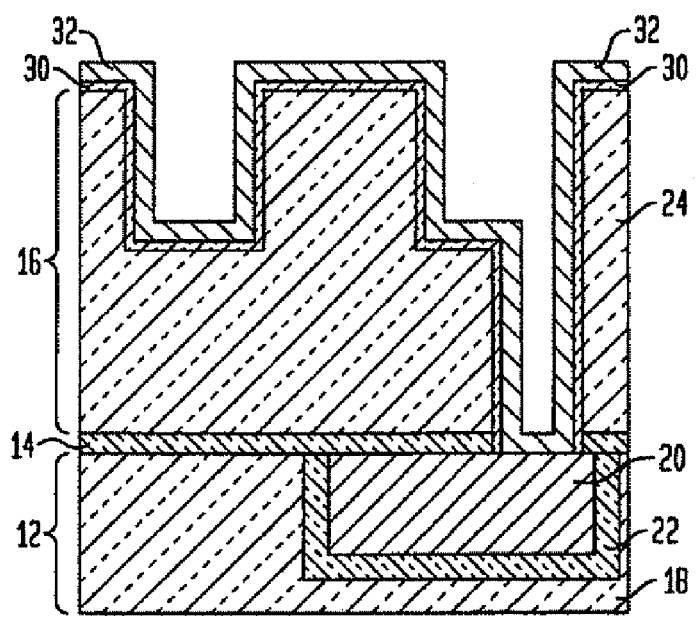
FIG. 3 is a pictorial representation (through a cross sectional view) illustrating the structure of FIG. 2 after forming a noble metal liner on said modified dielectric surface layer.

FIG. 3 shows the structure that is formed after forming a noble metal liner 32 on the exposed surface of the modified dielectric surface layer 30. The noble metal liner 32 is comprised of a metal or metal alloy from Group VIIIA of the Periodic Table of Elements. Examples of suitable Group VIIIA elements include, but are not limited to: Ru, Ta, Ir, Rh, Pt and alloys thereof such as, for example RuTa. In some preferred embodiments, Ru or RuTa is used as the noble metal liner. It is noted that the noble metal liner 32 of the present application serves as a diffusion barrier and, in some embodiments, as a plating seed layer as well.

The noble metal liner 32 is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the noble metal liner 32 may vary depending on a number of factors including, for example, the compositional material of the noble metal liner 32 and the technique that was used in forming the same. Typically, the noble metal liner 32 has a thickness from about 0.5 to about 10 nm, with a thickness of less than 6 nm being even more typical.

Figure 4:
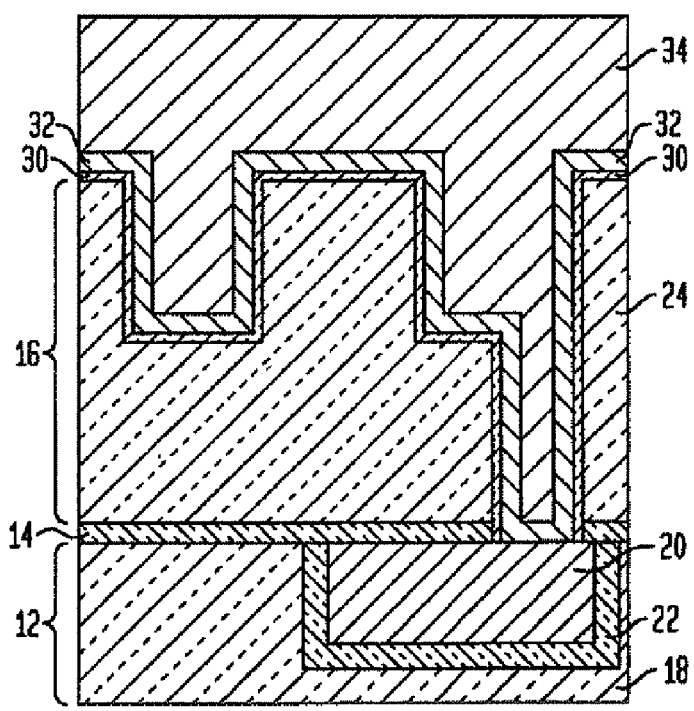
FIG. 4 is a pictorial representation (through a cross sectional view) illustrating the structure of FIG. 3 after deposition of an interconnect conductive material.

FIG. 4 shows the structure of FIG. 3 after filling the at least one opening within the second dielectric material 24 with an interconnect conductive material 34. The interconnect conductive material 34 may comprise the same or different conductive material as that present in conductive feature 20. Preferably, Cu, Al, W or alloys thereof are used, with Cu or AlCu being most preferred. The interconnect conductive material 34 is formed utilizing one of the deposition processes mentioned above in providing the conductive feature 20.

Figure 5:
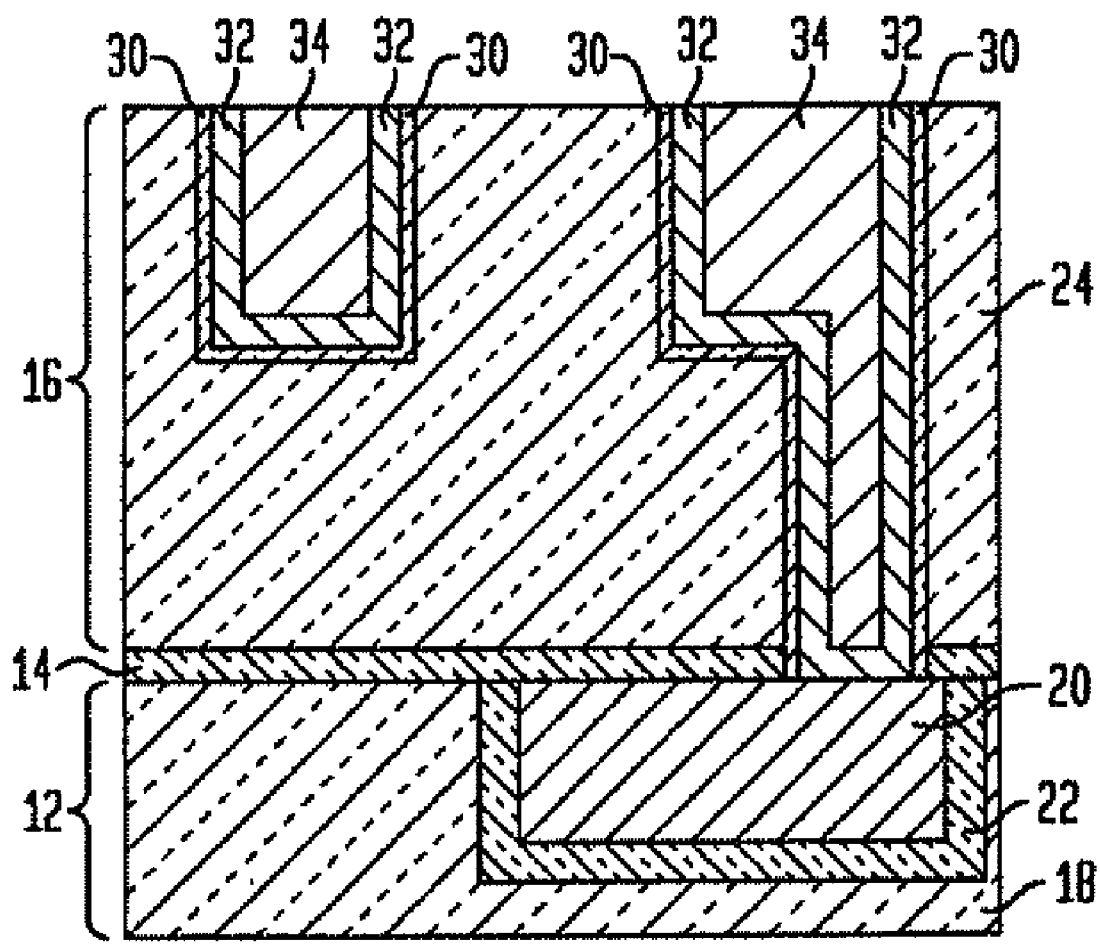
FIG. 5 is a pictorial representation (through a cross sectional view) illustrating the structure of FIG. 4 after planarization.

FIG. 5 shows the structure of FIG. 4 after performing a conventional planarization process such as, for example, grinding, chemical-mechanical polishing (CMP) or combinations thereof. Note that in FIG. 5 the upper surfaces of the second dielectric material 24, modified dielectric layer 30, the noble metal liner 32 and the interconnect conductive material 34 are substantially coplanar.

It is further noted that the structure shown in FIG. 5 represents a close-via bottom structure. In another embodiment of the present invention, an open-via bottom structure can be provided. In the open-via bottom structure, the interconnect conductive material 34 is in direct contact with a surface of the at least one conductive feature 20. The open-via bottom structure is formed by removing the noble metal liner 32 from the bottom of via 28A utilizing ion bombardment or another like directional etching process. The present invention also contemplates an anchored-via bottom structure. The anchored-via bottom structure is formed by first etching a recess into the conductive feature 20 utilizing a selective etching process. The selective etching typically occurs after performing the above mentioned dielectric surface modification. After formation of the noble metal liner, the noble metal liner is typically removed from the bottom portion of the via and recess by a directional etching process. The conductive material 34 is then formed as described above.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
    a dielectric material including at least one opening located therein, wherein said at least one opening has sidewalls and wherein a modified surface portion of said dielectric material is hydrophobic and extends along an entirety of said sidewalls of said at least one opening;
    a noble metal liner within said at least one opening and on an upper surface of said modified surface portion that is hydrophobic; and
    an interconnect conductive material on said noble metal diffusion liner.

2. The interconnect structure of claim 1 wherein said dielectric material has a dielectric constant of about 4.0 or less.

3. The interconnect structure of claim 2 wherein said dielectric material comprises $SiO_2$, a silsesquioxane, a C doped oxide that includes atoms of Si, C, O and H, or a thermosetting polyarylene ether.

4. The interconnect structure of claim 1 wherein said at least one opening is a line opening, a combined line opening and a via opening, or combinations thereof.

5. The interconnect structure of claim 1 wherein said dielectric material is located atop an interconnect level including at least one conductive feature embedded within a dielectric having a dielectric constant of about 4.0 or less.

6. The interconnect structure of claim 1 wherein said noble metal liner comprises Ru, Ta, Ir, Pt or alloys thereof.

7. The interconnect structure of claim 1 wherein said interconnect conductive material comprises polySi, a conductive metal, an alloy comprising at least one conductive metal, a conductive metal silicide or combinations thereof.

8. The interconnect structure of claim 1 wherein said noble metal liner comprises a Ru-containing material, and said interconnect conductive material comprises a Cu-containing material.

9. The interconnect structure of claim 1 wherein said noble metal liner is present in a bottom portion of the at least one opening.

10. The interconnect structure of claim 1 wherein said noble metal liner is absent from a bottom portion of the liner, and said interconnect conductive material is in direct contact with an underlying conductive feature embedded within a lower interconnect level.

11. An interconnect structure comprising:

a dielectric material including at least one opening located therein, wherein said at least one opening has sidewalls and wherein a modified surface portion of said dielectric material is hydrophobic and extends along an entirety of said sidewalls of said at least one opening;

a Ru-containing liner within said at least one opening and located on an upper surface of said modified surface portion that is hydrophobic; and a Cu-containing interconnect conductive material on said Ru-containing noble metal liner.

\* \* \* \* \*